United States Patent
Li et al.

(10) Patent No.: US 8,794,140 B2
(45) Date of Patent: Aug. 5, 2014

(54) MAGNETIC ORIENTING AND PRINTING

(75) Inventors: Xiang Li, Beijing (CN); Claude-Alain Despland, Prilly (CH); Edgar Mueller, Fribourg (CH); Pierre Degott, Crissier (CH); Anton Bleikolm, Ecublens (CH); Alexandre Sudan, Beijing (CN)

(73) Assignees: SICPA Holding SA, Prilly (CH); China Banknote SICPA Security Ink Co., Ltd., Beijing (CN)

( * ) Notice: Subject to any disclaimer, the term of this patent is extended or adjusted under 35 U.S.C. 154(b) by 559 days.

(21) Appl. No.: 13/133,850

(22) PCT Filed: Dec. 10, 2009

(86) PCT No.: PCT/EP2009/066826
§ 371 (c)(1),
(2), (4) Date: Nov. 23, 2011

(87) PCT Pub. No.: WO2010/066838
PCT Pub. Date: Jun. 17, 2010

(65) Prior Publication Data
US 2012/0055355 A1    Mar. 8, 2012

(30) Foreign Application Priority Data

Dec. 10, 2008   (WO) ................. PCT/IB2008/003406

(51) Int. Cl.
*B41M 1/12* (2006.01)
*B41F 15/08* (2006.01)
*B41F 15/12* (2006.01)
*B41F 15/22* (2006.01)
*B42D 15/00* (2006.01)
*H05K 1/02* (2006.01)

(52) U.S. Cl.
CPC ............. *B41F 15/0818* (2013.01); *B41F 15/12* (2013.01); *B41F 15/22* (2013.01); *B41M 1/125* (2013.01); *B42D 15/0013* (2013.01); *B41P 2215/50* (2013.01); *B42D 2033/16* (2013.01); *H05K 1/0266* (2013.01)
USPC ........................... 101/129; 101/126; 101/491

(58) Field of Classification Search
CPC ............. B41F 15/0813; B41F 15/0818; B41F 15/0845; B41F 15/085; B41F 15/18; B41F 15/12; B41F 15/22; B41P 2215/00; B41P 2215/50; B42D 2033/16; H05K 3/1216
USPC ....................... 101/123, 129, 389.1, 126, 491
See application file for complete search history.

(56) References Cited

U.S. PATENT DOCUMENTS 4,838,648 A  6/1989  Phillips et al.
6,875,522 B2  4/2005  Seto et al.
(Continued)

FOREIGN PATENT DOCUMENTS

DE  37 32 116  4/1988
EP  1 641 624  4/2008
(Continued)

OTHER PUBLICATIONS

U.S. Appl. No. 11/912,348 to Claude-Alain Despland et al., filed Nov. 1, 2007.
(Continued)

*Primary Examiner* — Leslie J Evanisko
(74) *Attorney, Agent, or Firm* — Greenblum & Bernstein, P.L.C.

(57) ABSTRACT

Device and process for producing indicia comprising magnetically oriented magnetic or magnetizable particles in ink or coating composition on a sheet of substrate material. Device includes a flat-bed screen-printing unit having a flat printing screen and a printing platen for receiving a sheet. Printing platen has an upper surface facing the printing screen and a first direction along its upper surface along which said sheet is unloadable, and a magnetic orienting unit having multiple magnet assemblies. Magnetic orienting unit is disposed below upper surface of the printing platen, the multiple magnet assemblies are disposed along first direction, and all of the magnet assemblies are concomitantly movable from a first position away from the upper surface of the printing platen to a second position close to the upper surface of the printing platen. The magnetic orienting unit having one or more magnet assemblies is usable as a stand-alone flat-bed magnetization device.

22 Claims, 10 Drawing Sheets

(56) References Cited

U.S. PATENT DOCUMENTS

| | | | |
|---|---|---|---|
| 2004/0009309 A1* | 1/2004 | Raksha et al. | ............... 427/598 |
| 2007/0080533 A1 | 4/2007 | Bleikolm et al. | |
| 2008/0216739 A1 | 9/2008 | Bachman | |
| 2008/0217575 A1 | 9/2008 | Bachman | |
| 2008/0289526 A1 | 11/2008 | Bachman | |
| 2009/0184169 A1 | 7/2009 | Degott et al. | |
| 2009/0261572 A1 | 10/2009 | Bleikolm et al. | |
| 2010/0162909 A1 | 7/2010 | Degott et al. | |
| 2010/0181753 A1 | 7/2010 | Magnin et al. | |
| 2011/0043789 A1 | 2/2011 | Muller et al. | |
| 2011/0215562 A1 | 9/2011 | Bleikolm et al. | |

FOREIGN PATENT DOCUMENTS

| | | |
|---|---|---|
| EP | 1 961 559 | 8/2008 |
| WO | 2005/000585 | 1/2005 |
| WO | 2005/002866 | 1/2005 |
| WO | 2006/061301 | 6/2006 |
| WO | 2007/131833 | 11/2007 |
| WO | 2008/009569 | 1/2008 |
| WO | 2008/046702 | 4/2008 |
| WO | 2008/109134 | 9/2008 |
| WO | 2010/115928 | 10/2010 |
| WO | 2010/115986 | 10/2010 |

OTHER PUBLICATIONS

U.S. Appl. No. 12/304,546 to Pierre Degott et al., filed Sep. 26, 2011.
U.S. Appl. No. 13/130,683 to Claude-Alain Despland et al., filed May 23, 2011.
U.S. Appl. No. 12/093,982 to Marlyse Demartin Maeder et al., filed Jun. 5, 2008.
U.S. Appl. No. 61/491,734 to Olivier Lefebvre et al., filed May 31, 2011.
U.S. Appl. No. 61/439,591 to Pierre Degott et al., filed Feb. 4, 2011.
Pakastani Office Action dated Feb. 18, 2011 with respect to patent family member Pakistani App. No. 1094/2009.
International Search Report for PCT/EP2009/066826, mailed Mar. 29, 2010.
International Preliminary Report on Patentability for PCT/EP2009/066826, mailed Jun. 23, 2011.

* cited by examiner

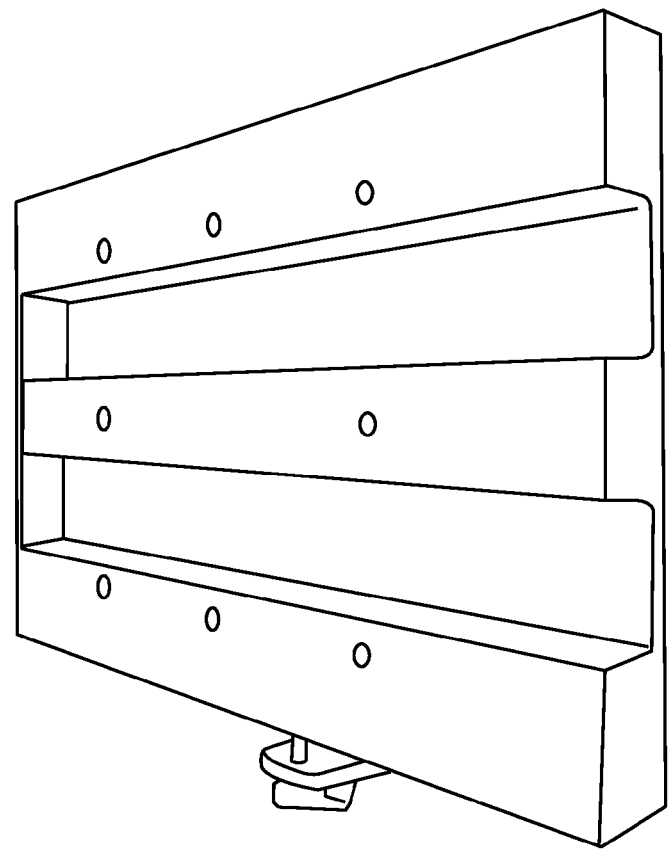
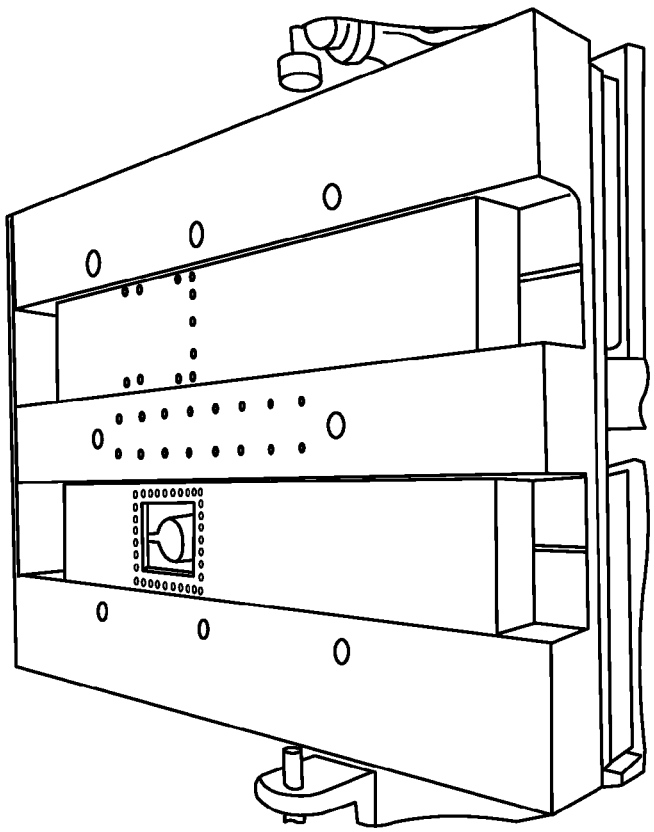
FIG. 4a (ii)
FIG. 4a (iii)

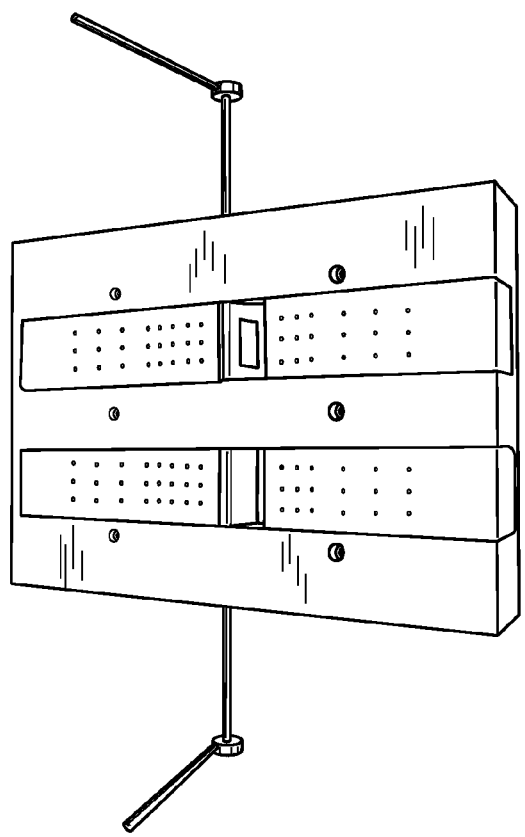
FIG. 4b (i)
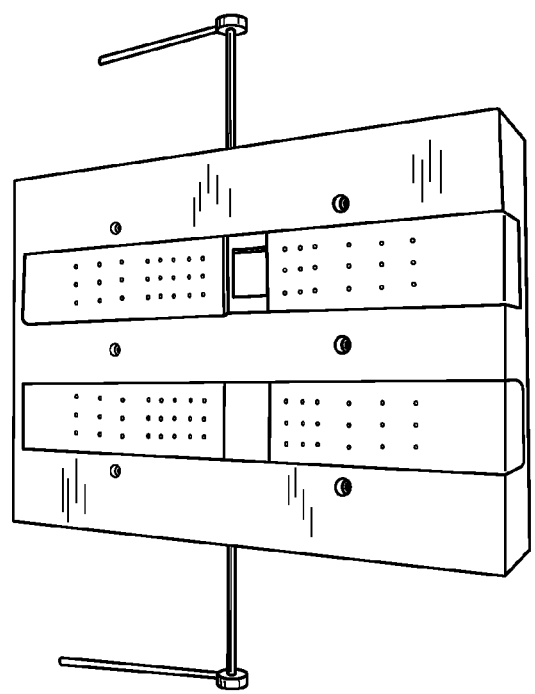
FIG. 4b (ii)

FIG. 4c (ii)

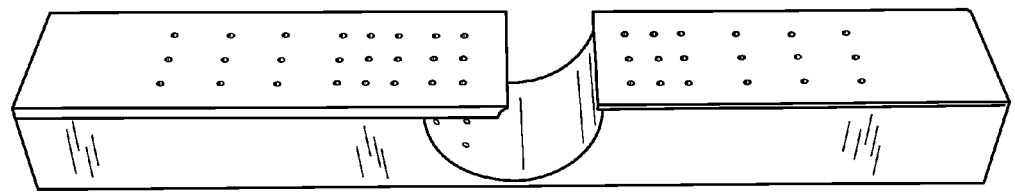
FIG. 4d (i)
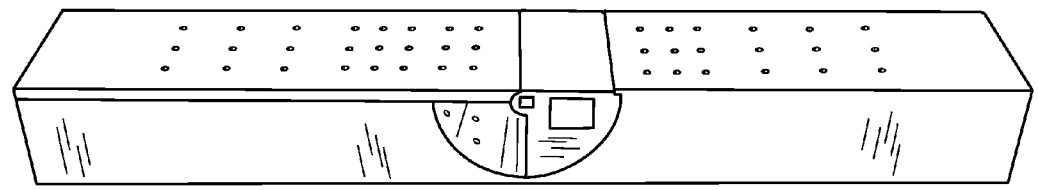
FIG. 4d (ii)
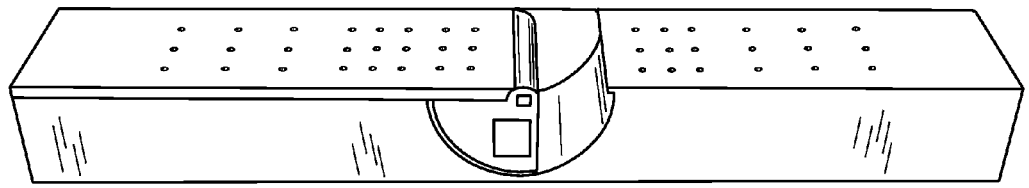
FIG. 4d (iii)

MAGNETIC ORIENTING AND PRINTING

FIELD OF INVENTION

The present invention is in the field of security document printing. It concerns a printing process and a corresponding printing device, particularly a silkscreen printing unit, for the printing of ink-based security features comprising magnetically oriented pigment particles in a hardened ink or coating composition.

BACKGROUND

Magnetically oriented pigment particles in a printed and cured ink are known as a security feature for the protection of value documents. Particular magnetic devices and processes for producing said security features are known as well, e.g. from EP-B 1 641 624, WO-A 2006/061301, WO-A 2008/009569, and WO-A 2008/046702. An industrial screen-printing machine for the rotary printing of said security features has been disclosed in WO-A 2005/000585. In said machine, the screen-printing units and the magnetic orienting devices have, both, the form of rotary drums.

WO-A 2005/000585 discloses a stand-alone rotary magnetic orienting device, which can be used subsequent to a printing process, e.g. as an additional process station following e.g. a conventional flat-bed screen printing unit, in order to impose a particular orientation to magnetic or magnetizable pigment particles comprised in a freshly printed ink, prior to hardening (drying, curing) said ink. Optically variable magnetic pigment particles are known from U.S. Pat. Nos. 4,838,648 and 6,875,522.

No magnetic orienting device combining a flat-bed screen-printing unit with a magnetic orienting unit in a single process station has, however, been disclosed up to now. On the other hand, flat-screen flat-bed screen-printing equipment being of extended industrial use, there is a long-felt need for a magnetic orienting unit adapted to work with this type of printing equipment.

SUMMARY OF THE INVENTION

A device according to the present invention, for producing indicia comprising magnetically oriented magnetic or magnetizable particles in an ink or coating composition on a sheet of substrate material, comprises:
a flat-bed screen-printing unit having a flat printing screen and a printing platen for receiving said sheet, the printing platen having an upper surface facing the printing screen and a first direction along its upper surface along which said sheet is unloadable, and a magnetic orienting unit comprising multiple magnet assemblies.

The magnetic orienting unit is disposed below the upper surface of the printing platen, said multiple magnet assemblies are disposed along said first direction, and all of said magnet assemblies are concomitantly movable from a first position away from the upper surface of the printing platen to a second position close to the upper surface of the printing platen.

In the context of the present disclosure, the term 'magnetic' refers to material which is itself a source of a magnetic field. The term 'magnetizable' refers to ferromagnetic or ferrimagnetic material which reacts to a magnetic field, without being a source of it.

In a first principal embodiment of the invention, the magnet assemblies are movable between the first position and the second position in a reciprocating movement along a second direction transverse (preferably orthogonal) to the upper surface of the printing platen. The coated substrate material can only be unloaded once the magnet assemblies are moved back to the first position, resulting in mandatory waiting times during the production process.

To avoid waiting times and thus to speed up the process, in a second principal embodiment of the invention, the magnet assemblies are movable between the first position and the second position in a forth-back rolling movement. Using such forth-back rolling movement, said moving back of the magnet assemblies and said unloading of the coated substrate material can be performed in a concomitant, synchronized movement, so as to prevent blurring of the produced magnetic image on the sheet.

Preferably, at least one of the magnet assemblies comprises an engraved and magnetized plate of permanent magnetic material, such as disclosed in EP-B 1 641 624.

Preferably, the engraved and magnetized plate is a composite material, comprising a polymer as a structural binder, preferably a rubber- or plastic-like polymer, and a permanent-magnetic powder as filler.

Preferably, at least one of said magnet assemblies comprising an engraved and magnetized plate of permanent magnetic material comprises at least one additional permanent magnet, mounted in a position which holds it against the inherent magnetic forces working between the magnet and the engraved magnetized plate, such as disclosed in WO-A 2008/046702.

The flat-screen-printing unit noteworthy also allows imprinting a substrate with a security element comprising oriented optically variable magnetic pigment particles. Optically variable magnetic pigments (OVMP) are noteworthy used for the protection of security documents, such as banknotes, value documents, cards, transportation tickets, passports, identity documents, access documents, tax-excise documents, and product labels.

The screen-printing mesh must be chosen such as to have the appropriate mesh size and thickness for printing the ink or coating composition. Particularly in embodiments, where the ink or coating composition comprises optically variable magnetic or magnetizable pigment particles, which typically have the form of irregular platelets with an average diameter in the range of 15 to 20 micrometers with a top-cut in the range of 25 to 35 micrometers, and a thickness of the order of 1 micrometer, the mesh size of the screen-printing mesh has to be chosen such as to allow for the safe passing of the optically variable magnetic or magnetizable particles through the screen without compromising the printing quality. Therefore, the screen-printing mesh preferably has a free mesh aperture of about twice the top-cut of the pigment particle size, i.e. in the range or 40 to 90 micrometers, preferably in the range of 50 to 70 micrometers.

The film thickness of the printed ink deposit, in order to allow for an easy orientation of the particles should be preferably roughly the average pigment particle size, i.e. in the range of 15 to 20 micrometers.

Further, a process for producing indicia is disclosed, which comprises the steps of:
a) providing a device according to the present invention;
b) loading onto the printing platen of the device a sheet of substrate material carrying at least on a part of its surface a wet ink or coating composition comprising magnetic or magnetizable particles;
c) concomitantly moving all of the magnet assemblies of the device from a first position away from the upper surface of the printing platen to a second position close to the upper surface of the printing platen, hereby orienting said magnetic or magnetizable pigment particles in the wet ink or coating composition;

d) moving the magnet assemblies back to said first position;
e) unloading the sheet from the printing platen; and
f) curing the ink.

In the context of the present disclosure, the term "wet ink or coating composition" stands for a coating composition, which has been applied to a substrate, but not yet hardenend (cured, dried).

In a preferred embodiment of the process according to the invention, the moving of the magnet assemblies between the first position and the second position is performed in a reciprocating movement along a second direction transverse to upper surface of the printing platen.

In another preferred embodiment of the process, the moving of the magnet assemblies between the first position and the second position is performed in a forth-back rolling movement. Using said rolling movement, the moving of the magnet assemblies and the unloading of the sheet are performed in a synchronized movement so as to prevent blurring of the magnetic image produced on the sheet.

In a particularly preferred embodiment of the process, the step of loading a sheet of substrate material onto the printing platen of the device includes a step of coating or imprinting the surface of the sheet at least in part with a wet coating composition or ink comprising magnetic or magnetizable particles.

In yet another preferred embodiment, said coating or imprinting is performed using a flat printing screen having a mesh aperture in the range of 40 to 90 micrometers, preferably in the range of 50 to 70 micrometers.

In a further preferred embodiment, said coating or imprinting is performed using a composition comprising optically variable magnetic pigment particles.

Further preferred are a process variant wherein said step of coating or imprinting is performed concomitantly with said magnetic orienting of the pigment particles, and a process variant, wherein said magnet assemblies are moved towards the printing platen before imprinting said sheet.

The device and the process according to the present invention can be used for producing indicia through the magnetic orienting of magnetic or magnetizable particles in a coating composition on a document.

Such document may in particular be a security document, preferably chosen from the group consisting of the banknotes, the value documents, the cards, the transportation tickets, the passports, the identity documents, the access documents, the tax-excise documents, and the product labels.

DETAILED DESCRIPTION

Figure 1A:
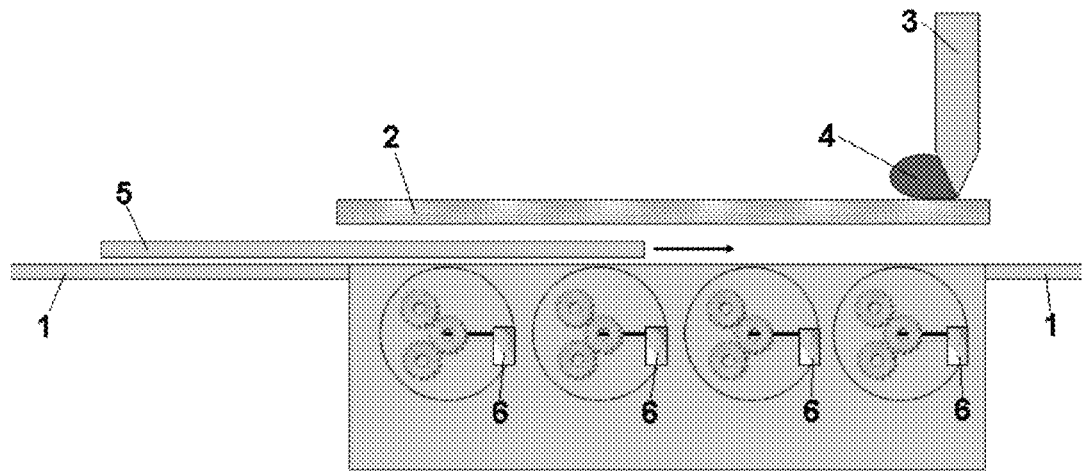
FIG. 1a-1d schematically depict a device for producing indicia by magnetic orienting of magnetic or magnetizable particles in an ink or coating composition on a sheet of substrate material, according to an embodiment of the present invention.

The device and the printing process of the present invention are now further explained with reference to the drawings.

A device according to the present invention, for producing indicia comprising magnetically oriented magnetic or magnetizable particles in an ink or coating composition on a sheet of substrate material, comprises a flat-bed screen-printing unit having a flat printing screen and a printing platen for receiving said sheet and a magnetic orienting unit comprising multiple magnet assemblies. The printing platen has an upper surface facing the printing screen, a first direction along its upper surface along which said sheet is unloadable. The magnetic orienting unit is disposed below the upper surface of the printing platen, and the multiple magnet assemblies are disposed along said first direction along the upper surface. All of the magnet assemblies are concomitantly movable from a first position away from the upper surface of the printing platen to a second position close to the upper surface of the printing platen.

Further, a process for producing indicia according to the present invention comprises the steps of:

a) providing a device according to the present invention;
b) loading onto the printing platen of the device a sheet of substrate material carrying at least on a part of its surface a wet ink or coating composition comprising magnetic or magnetizable particles;
c) concomitantly moving all of the magnet assemblies of the device from a first position away from the upper surface of the printing platen to a second position close to the upper surface of the printing platen, hereby orienting said magnetic or magnetizable pigment particles in the wet ink or coating composition;
d) moving the magnet assemblies back to said first position;
e) unloading the sheet from the printing platen; and
f) curing the ink.

According to the invention, the magnetic orienting unit being disposed below the printing platen of the screen-printing unit, allows the magnet assemblies to be moved from below (removed position) into a position close to the printing platen (applied position), such that the magnetic field of the magnet assemblies penetrates the printing platen and the sheet of substrate material disposed on it, hereby orienting magnetic or magnetizable pigment particles in a wet ink or coating layer applied on said sheet of substrate. As is obvious to the skilled person, the printing platen must be permeable to static magnetic fields.

It should also be noted that not only the orientations, but also the positions of the magnetic or magnetizable particles may be influenced by the magnetic field, as known to the skilled in the art. Thus, under the influence of an inhomogeneous magnetic field, the particles will not only adopt determined orientations, but also arrange more or less densely in space. This explains why even in the case of spherical particles (e.g. soft-magnetic carbonyl iron particles), which have no preferred orientation in a magnetic field, a magnetic "orientation" image can be obtained: cf. WO 2005/002866; in fact, the observed image in this case is a particle density image.

An important aspect of the invention is that the magnetic orienting unit comprises multiple magnet assemblies. This is required by the technical constraints of the screen-printing process, which only supports a single printing pass per sheet without intermediate drying. Any second touching of the imprinted, wet sheet by the printing screen would noteworthy result in a smearing-out of the already printed indicia. On the other hand, there is generally a plurality of repetitive items to be printed on a same sheet, distributed over its two dimensions; thus every printed item needs its own magnet assembly, and all magnet assemblies must be moved concomitantly during the magnetic orienting process.

The orienting unit is furthermore disposed such that both, the screen-printing process and the magnetic orienting process can be performed concomitantly.

To fix the orientation of the magnetic or magnetizable pigment particles within the coating composition comprising it, the ink or coating layer must be hardened (dried) subsequently. To this aim, the coated substrate material must be subject to a curing treatment, preferably radiation curing such as photopolymerization (e.g. UV-curing) or electron-beam curing. As is obvious to the skilled person, the coating composition must be chosen such as to be cure-able according to the chosen curing mechanism.

The curing may take place through irradiation on the printing platen, and the coated substrate material can be unloaded subsequently from the printing platen. Preferably, however, the substrate material is unloaded from the printing platen and cured by particularly conceived drier equipment. When unloading the substrate material from the printing platen, care must be taken for not to blur the produced magnetic orientation image through a possible relative shift of the substrate material with respect to the magnet assembly underneath it. Said magnet assembly must thus be moved away before unloading the substrate material in such a way as not to blur or destroy the previously produced magnetic pigment orientation image.

A preferred way of moving away the magnet assembly is through a movement transverse to the substrate surface, whilst the printed and magnetically oriented substrate itself is at rest.

Another way of moving away the magnet assembly is through a rolling movement, concomitant with the tangential removal of the printed and magnetically oriented substrate.

It must be emphasized that the present invention also comprises embodiments in which the movement of the magnet assembly is chosen somewhere in between a pure reciprocating and a pure rolling movement. This can noteworthy be achieved through an appropriate choice of a center of rotation (axis of rotation) for the magnet assembly. Choosing the rotation axis one radius apart from the plane of the moving substrate enables the embodiment of a pure rolling movement, wherein the substrate moves tangentially, in line with the magnet assembly, and concomitant with the latter. Choosing the rotation axis close to the plane of the moving substrate enables the embodiment of a pure reciprocating movement, wherein the magnet assembly moves transverse to the plane of the substrate. Choosing the rotation axis somewhere in between both said extremes enables the embodiment of movements in between a pure reciprocating and a pure rolling movement.

Most preferred magnetic or magnetizable particles in the context of the present invention are optically variable magnetic pigment particles, e.g. such as disclosed in U.S. Pat. Nos. 4,838,648 and in 6,875,522. Optically variable magnetic pigment (OVMP) is noteworthy used for the protection of security documents, such as banknotes, value documents, cards, transportation tickets, passports, identity documents, access documents, tax-excise documents, and product labels. The said optically variable pigment particles have the form of irregular platelets, having an average diameter in the range of 15 to 20 micrometers with a top-cut in the range of 25 to 35 micrometers, and a thickness of the order of 1 micrometer.

In a particularly preferred option, the process for producing indicia includes a printing step, in which an ink or coating composition comprising magnetic or magnetizable particles is applied onto said sheet of substrate material. In this particular embodiment, providing said sheet of substrate material includes thus the step of coating or imprinting its surface at least in part with a wet ink or coating composition comprising magnetic or magnetizable particles.

Most preferably, said coating or imprinting is performed by screen-printing on the flat-screen, flat-bed press, using an appropriate flat printing screen, a squeegee and said appropriate ink or coating composition.

The imprinting of the substrate sheet and the magnetic orienting of the pigment particles can furthermore be performed either sequentially, or concomitant with each other.

In a particular embodiment of the process, said magnet assembly is moved towards the printing platen of the flat-bed equipment before moving the squeegee over the inked printing screen. This results in a maximum of exposition time for the magnetic or magnetizable particles to orient themselves in the field of the magnet assembly.

Reference is now made to FIGS. 1a to 1d, which each schematically depict a device according to an embodiment the preferred second principal embodiment of the present invention for producing indicia by magnetic orienting of magnetic or magnetizable particles in an ink or coating composition on a sheet of substrate material, and illustrate an embodiment of the printing process:

In FIG. 1a a sheet (5) to be imprinted is loaded onto the printing platen (1) of the flat-screen, flat-bed screen-printing press. The printing screen (2), the squeegee (3), and the ink (4) are in removed position. The magnet assemblies (6) are in removed position.

Figure 1B:
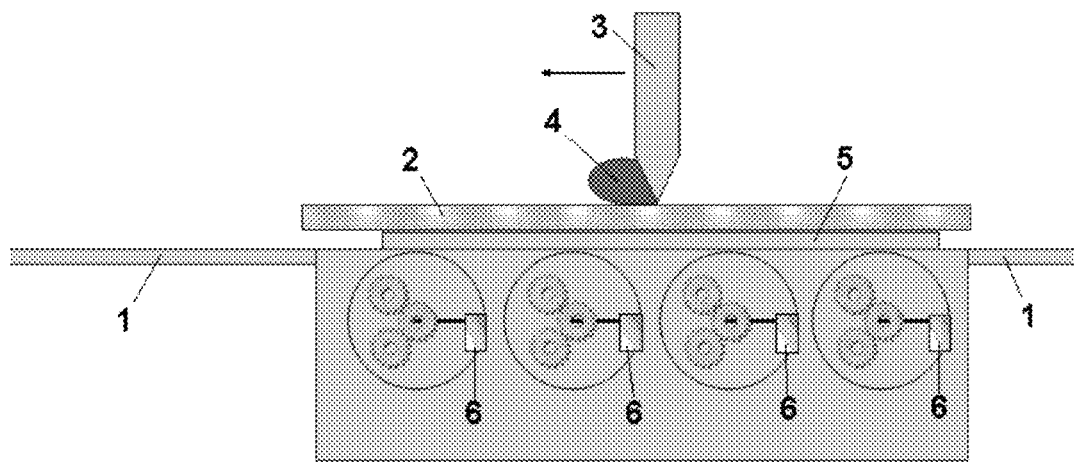

In FIG. 1b the sheet (5) is in printing position, the printing screen (2) is in lowered position, and the squeegee (3) moves the ink (4) over the screen (2), imprinting the sheet (5). The magnet assemblies (6) are in removed position.

Figure 1C:
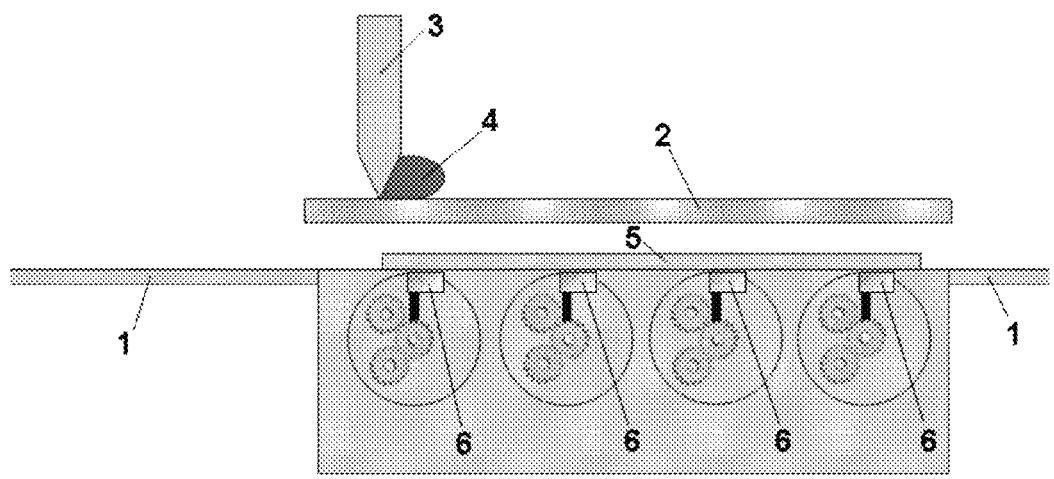

In FIG. 1c the sheet (5) is in printing position; the printing screen (2), the squeegee (3), and the ink (4) are in removed position. The magnet assemblies (6) are in applied position, orienting the magnetic or magnetizable particles in the printed ink.

Figure 1D:
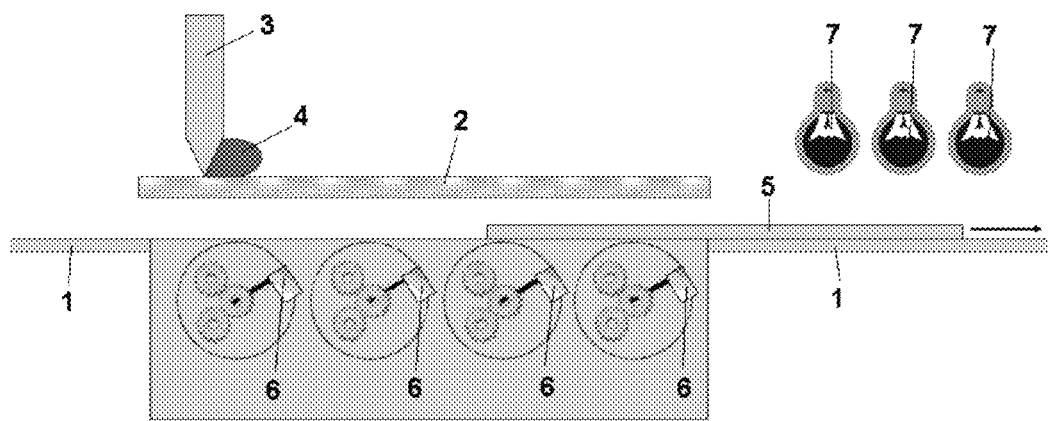

In FIG. 1d the printed and oriented sheet (5) is unloaded from the printing platen (1) of the flat-bed screen-printing machine. The magnet assemblies (6) are concomitantly moving into removed position. The printed ink is cured through the action of UV-drying equipment (7), fixing the magnetic or magnetizable particles in the oriented state.

Figure 2A:
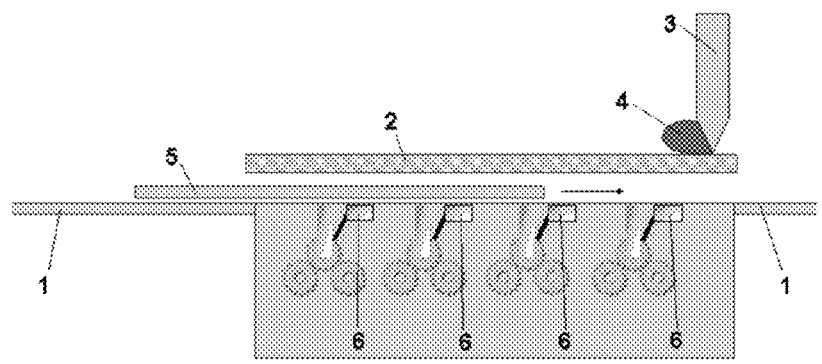
FIGS. 2a-2c schematically illustrate an alternative embodiment of the printing process, using the same equipment, according to an embodiment of the present invention.
Figure 2B:
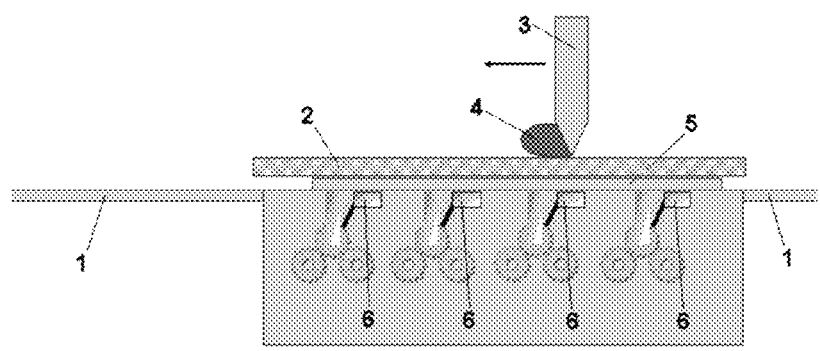
Figure 2C:
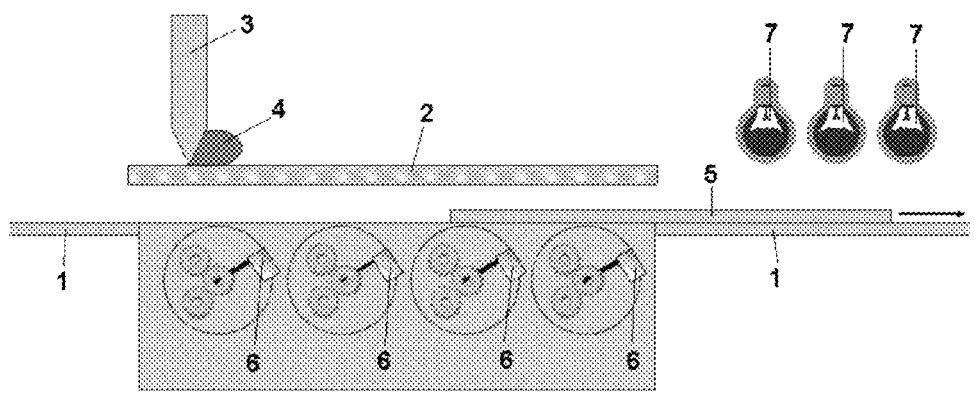

Reference is now made to FIGS. 2a to 2c, which schematically illustrate an alternative embodiment of the printing process, using the same equipment:

In FIG. 2a a sheet to be imprinted (5) is loaded onto the printing platen (1) of the flat-screen, flat-bed screen-printing machine. The printing screen (2), the squeegee (3), and the ink (4) are in removed position. The magnet assemblies (6) are in applied position.

In FIG. 2b the sheet (5) is in printing position, the printing screen (2) is in lowered position, and the squeegee (3) moves the ink (4) over the screen (2), imprinting the sheet (5). The magnet assemblies (6) are in applied position, orienting the magnetic or magnetizable particles in the printed ink concomitantly with the printing process.

In FIG. 2c the printed and oriented sheet (5) is unloaded from the printing platen (1) of the flat-bed screen-printing machine. The magnet assemblies (6) are concomitantly moving into removed position. The printed ink is cured through the action of UV-drying equipment (7), fixing the magnetic or magnetizable particles in the oriented state.

Figure 3A:
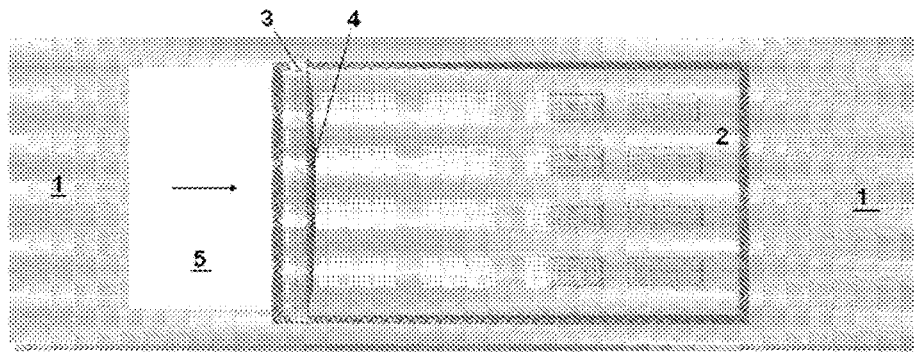
FIGS. 3a-3c Schematically illustrate the printing process as seen from the top.
Figure 3B:
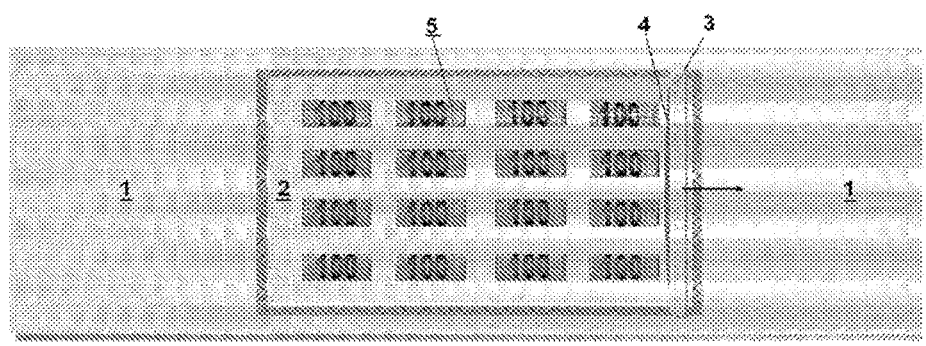
Figure 3C:
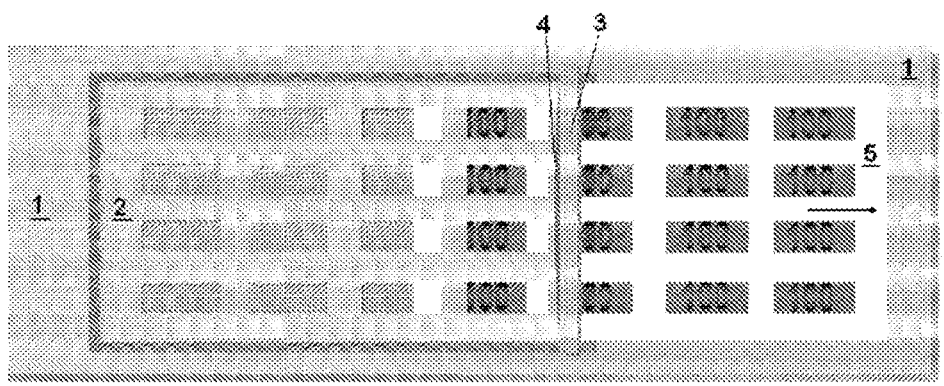

Reference is now made to FIGS. 3a to 3c, which schematically illustrate the printing process, as seen from the top:

In FIG. 3a a sheet to be imprinted (5) is loaded onto the printing platen (1) of the flat-screen, flat-bed screen-printing machine. The printing screen (2), the squeegee (3), and the ink (4) are in removed position. The magnet assemblies (not visible) are in applied position.

In FIG. 3b the sheet (5) is in printing position, the printing screen (2) is in lowered position, and the squeegee (3) moves the ink (4) over the screen (2), imprinting the sheet (5). The magnet assemblies in applied position orient the magnetic or magnetizable particles in the printed ink concomitantly with the printing process.

In FIG. 3c the printed and oriented sheet (5) is unloaded from the printing platen (1) of the flat-bed screen-printing machine. The printing screen (2), the squeegee (3), and the ink (4) are in removed position.

Figure 4A:
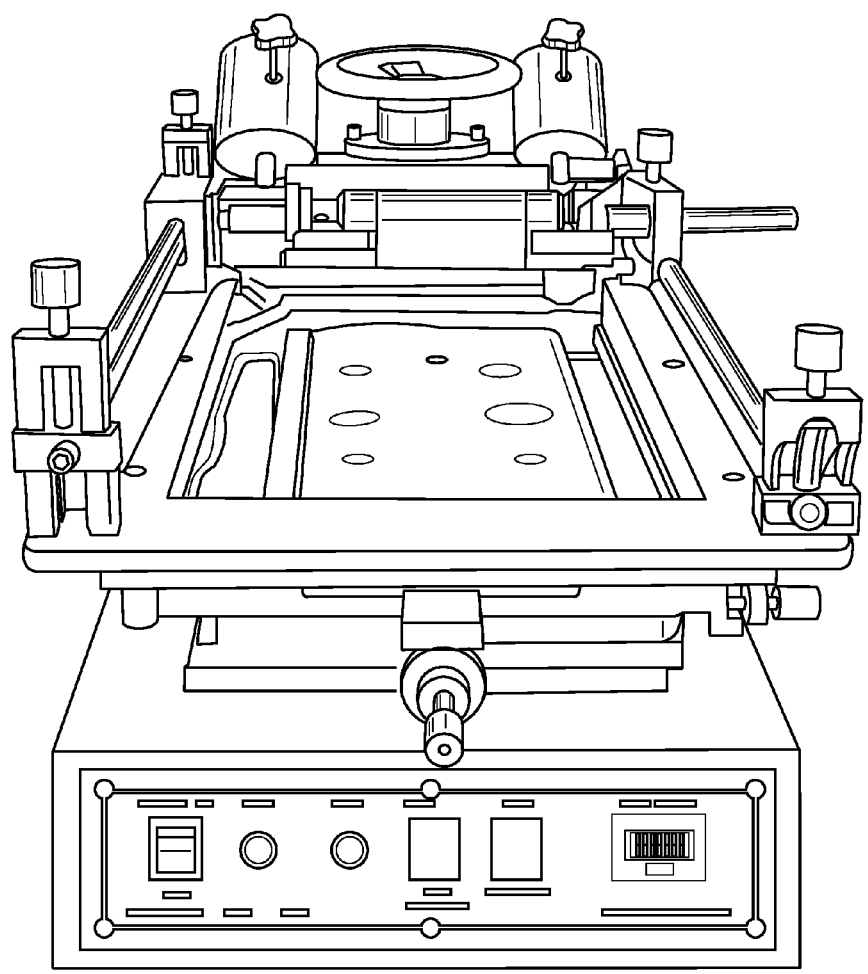
FIGS. 4a(i) - 4a(iii), 4b(i) - 4b(ii), 4c(i) - 4c(ii), and 4d(i) - 4d(iii) show a prototype of a device according an embodiment of the invention.

Reference is now made to FIGS. 4a to 4d, which illustrate a prototype a device according to an embodiment of the present invention:

FIGS. 4a(i) - 4a(iii) shows in three different illustrations of a BMSP-150M flat-screen, flat-bed silkscreen printing unit with details of the modified printing platen as follows:
(i) overall view of the printing unit;
(ii) printing platen with the magnetic orienting units inserted;
(iii) printing platen with the magnetic orienting units removed.

FIG. 4b shows in two different views (i) and (ii) a printing platen of a device having rotatable magnet assemblies, according to the second principal embodiment of the invention
(i) in "applied position";
(ii) in "removed position".

Figure 4C:
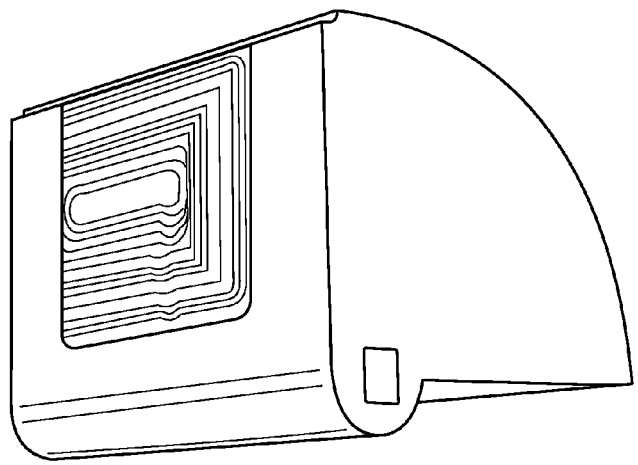
Figure 4C:
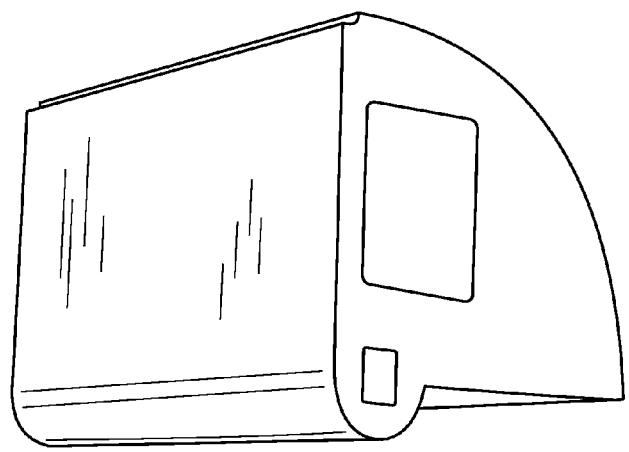

FIG. 4c shows in two different views (i) and (ii) rotatable magnet assemblies according to an embodiment of the invention
(i) for producing a "rolling bar" feature;
(ii) for producing "light switch" or "3D" features.

FIG. 4d shows in three different views (i) to (iii) an exemplary support block of a magnetic orienting unit for a device according to the second principal embodiment of the invention
(i) without an inserted magnet assembly
(ii) having an inserted magnet assembly in "applied position"
(iii) having an inserted magnet assembly in "removed position"

Reference is now made to FIGS. 5a to 5e, which depict different types of screen-printing meshes that can be used in various embodiments of the invention:
a) a first type of multi-filament woven fabric;
b) a second type of multi-filament woven fabric;
c) a mono-filament calandered mesh;
d) cross-section of the calandered mesh;
e) a galvanically formed porous metal foil;

The flat printing screen may be of any type known in the art of screen-printing; it comprises a frame, made e.g. of wood, or preferably of aluminum, and a screen-printing mesh carried by the said frame. The screen-printing mesh, carrier of the printing stencil, may in particular be a piece of porous, finely woven fabric, multi-filament (FIG. 5a, 5b) or mono-filament (FIG. 5c), made of nylon, polyester or stainless steel. Most preferred is a mono-filament frame of low-elongation polyester, or a stainless steel frame. Alternatively, the screen-printing mesh may be a chemically etched, a laser-etched, or a galvanically formed porous metal foil (FIG. 5e), e.g. a stainless steel foil.

Screen and metallic parts in contact with the printing ink and/or the printed substrate should be of non-magnetic material, in order to avoid any interference with the magnetic pigments and the magnetic orientation process.

Figures 5A, 5B, 5C, 5D:
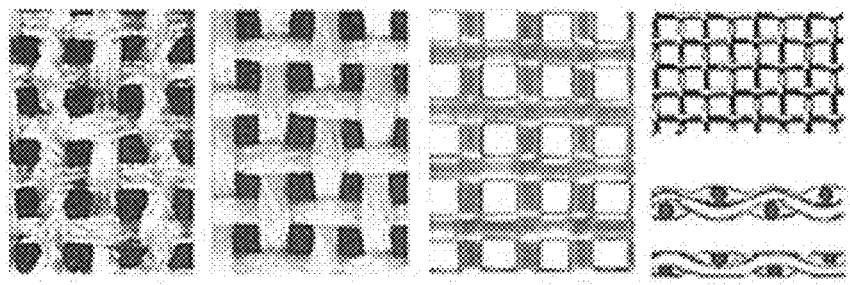
FIGS. 5a-5g depict various types of screen-printing meshes according to various embodiments of the invention.

The screen-printing mesh is further characterized by its weaving parameters, i.e. the weaving scheme, the mesh count (mesh/inch or mesh/cm), the mesh thickness (in micrometers), and the thread diameter (in micrometers). From these, the aperture of the holes (in micrometers) and the theoretical ink deposit (in micrometers) can be derived. The mesh thickness is generally somewhat lower than twice the thread diameter, due to the staggered undulation of the thread, allowing for some vertical compression (calandering; FIG. 5d).

The screen-printing mesh is an important element of the present invention, which must be chosen such as to have the appropriate mesh size and thickness for printing the ink or coating composition comprising the most preferred optically variable magnetic or magnetizable pigment particles. The film thickness of the printed ink deposit, in order to allow for an easy orientation of the particles, should preferably be about the average pigment particle size, i.e. in the range of 15 to 20 micrometers. The screen-printing mesh should have a free mesh aperture of about twice the top-cut of the pigment particle size, in our case thus an aperture in the range of 50 to 70 micrometers.

The screen-printing mesh used in the present invention has therefore a preferred mesh aperture comprised in the range of 40 to 90 micrometers, most preferred is a mesh aperture in the range of 50 to 70 micrometers.

The mesh has further a preferred mesh count comprised in the range of 150 to 300 mesh/inch (corresponding to 60 to 120 mesh/cm), most preferred is a mesh count in the range of 180 to 250 mesh/inch (corresponding to 72 to 100 mesh/cm).

The mesh has a preferred thread diameter comprised in the range of 30 to 70 micrometers, most preferred is a thread diameter in the range of 45 to 55 micrometers.

Figures 5E, 5F, 5G:
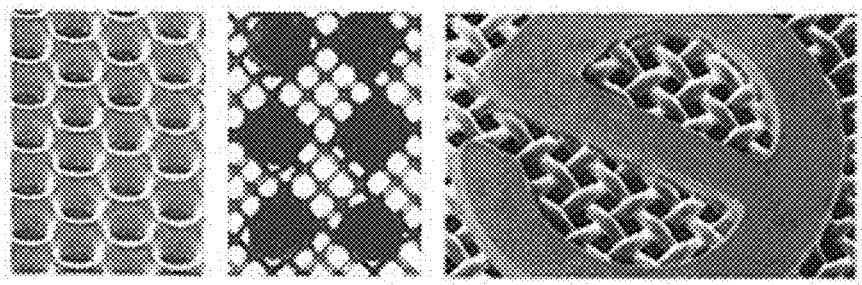
Figure 6:
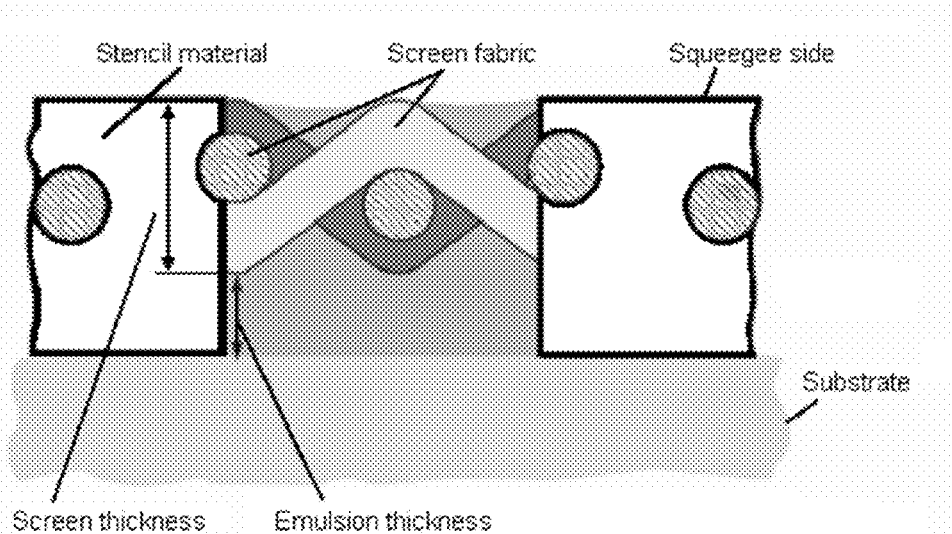
FIG. 6 depicts a cross section through a mono-filament screen-printing mesh carrying a photoresist printing stencil.

Reference is now made to FIG. 6 which depicts a cross section through a mono-filament screen-printing mesh carrying a photoresist printing stencil and to FIGS. 5f and 5g which show a computer-to-screen printing stencil, respectively a photoresist printing stencil. The printing stencil is the carrier of the printing information. It is advantageously produced through photoresist technology, wherein the whole of the screen-printing mesh is in a first step coated with a photoresist, said photoresist is in a second step photographically exposed to the printing information (positive or negative, depending on the resist type), and the exposed resist is in a third step chemically developed such as to selectively remove it from the screen-printing mesh in the zones where ink is to be printed. The result is a mesh carrying a printing stencil (FIG. 5g) Alternatively, the stencil can also be produced through an unselective coating of the whole mesh, followed by a selective mechanical ablation of the coating where ink is to be printed, or even more advantageously through selective Ink-Jet printing directly onto the mesh (Computer-to-Screen technology; FIG. 5f).

The devices and the processes according to the present invention can be used for producing indicia through the magnetic orienting of magnetic or magnetizable particles in a coating composition on a document. Said document may in particular be a security document, preferably chosen from the group consisting of the banknotes, the value documents, the cards, the transportation tickets, the pass-ports, the identity documents, the access documents, the tax-excise documents, and the product labels.

Exemplary Further Embodiments Of The Invention

A. Silkscreen Printing Unit

Reference is made to FIGS. 4a to 4d. The silkscreen printing unit (FIG. 4a (i)) is a laboratory flat-screen, flat-bed proofing press and consists of a printing station and a vacuum pump to retain the printing substrate on the printing platen. The printing platen was adapted to contain two magnetic orienting units (FIG. 4a (ii): units inserted; (iii) units removed).

Technical Data of the Screen-Printing Unit:

| | |
|---|---|
| Dimension of the printing station | 650 mm (L) × 550 mm (W) × 420 mm (H) |
| Weight | ~50 KG |
| Power supply | AC220 V, 0.37 KW |
| The maximum printing area | 150 mm × 150 mm |
| The maximum screen plate size | 460 mm × 320 mm |
| The flat-bed size | 350 mm × 250 mm |
| The printable substrate thickness | 0-25 mm |
| The circumferential adjustment of the flat bed | X, Y: ±10 mm; Q: ±3° |
| The adjustable angle of the squeegee | ±45° |

B. Printing Screen

The flat printing screen is based on a woven mesh of single-stranded polyester (S) or of polyester thread (T).

Such screen mesh can, e.g., be obtained from Shangshai Polyester Screen Printing Mesh Co., Ltd., Shanghai, China. The following mesh qualities were successfully used:

| mesh type | mesh/inch | aperture (µm) | thread (µm) | ink deposit (µm) |
|---|---|---|---|---|
| 61-64PW(T) | 155 | 90 | 64 | 30 |
| 77-48PW(S) | 195 | 77 | 48 | 28 |
| 77-55PW(T) | 195 | 67 | 55 | 24 |
| 90-48PW(T) | 230 | 56 | 48 | 19 |
| 120-31PW(S) | 305 | 49 | 31 | 17 |

The printing stencil is produced on the mesh by photoresist technology, as known in the art. The so obtained screen-printing mesh is mounted on an aluminum frame fitting onto the flat-bed proofing press.

C. Magnet Assemblies

The printing unit comprises a printing-screen (FIG. 4a (i)), a printing platen (FIG. 4b (i,ii)), magnet assemblies (FIG. 4c (i,ii)) and supporting blocks (FIG. 4d). Magnet assemblies and supporting blocks, as well as the mechanical parts for moving the magnet assemblies, form together a magnetic orienting unit.

The printing platen (FIG. 4b (i,ii)) was made so as to have 2 parallel channels, to hold and position two magnet assemblies.

Two standard magnet assemblies have been developed, to produce both, typical and customized pigment orientation effects (FIG. 4c (i,ii)):

a "Rolling bar"-effect producing magnet assembly; and
a "Light Switch"-effect or "3D effect" producing magnet assembly.

The "Light Switch" type of magnet assembly can be easily adapted for producing other customized effects There are two supporting blocks provided. Their main functions are i) to hold the magnet assemblies in position so as to allow for their rotating movement ii) to fill the gap in the channels so as to produce a flat printing surface.

D. Printing

In detail, the process for producing indicia through the magnetic orienting of magnetic or magnetizable particles in an ink or coating composition on a sheet of substrate material, such as can be used for making security documents, using the laboratory prototype equipment described here above, comprises the sequential steps of:

a) mounting the required magnet assemblies into the supporting blocks, in which the magnet assemblies are movably disposed as disclosed;

b) inserting the supporting blocks, with the magnet assemblies mounted, into the printing platen;

c) inserting 2 lateral handles through holes in the printing platen and the supporting blocks and connect them with the movably disposed magnet assemblies, and rotating the handles so that the magnet assemblies are in horizontal position;

d) mounting a flat printing screen, obtained as disclosed above, on the press, and fine-adjusting the positions of the magnet assemblies by adjusting the printing platen according to the position of the indicia on the printing screen;

e) connecting the ends of the 2 handles respectively to both sides of the printing screen;

f) lifting up the printing screen, which concomitantly produces a down-wards rotating movement of the magnet assemblies through the connections with the handles, and loading a sheet of substrate material onto the printing platen;

g) lowering the printing screen, which concomitantly produces an upwards rotating movement of the magnet assemblies through the connections with the handles, and registering (adjusting) the position of the sheet of substrate with the printing screen;

h) loading a UV-curing ink according to WO 2007/131833, comprising optically variable magnetic pigment, onto the printing screen and moving the ink with a squeegee under slight pressure over the screen, hereby imprinting the sheet of substrate and orienting the magnetic or magnetizable particles in the printed ink layer concomitantly with the printing process;

i) lifting up the printing screen, which concomitantly produces a downwards rotating movement of the magnet assemblies through the connections with the handles;

j) removing the imprinted and "magnetically oriented" substrate from the printing platen and hardening (curing, drying) the printed ink on the substrate through exposure to a UV-source;

k) repeating steps f) to j) for producing further sheets of printed substrate.

Based on the disclosure made herein above, the skilled person will be able to conceive further embodiments of the present invention, in particular embodiments having a larger printing surface, more than two magnetic orientation units, and a further automated and industrialized printing and magnetic orienting process.

The invention claimed is:

1. Device for producing indicia comprising magnetically oriented magnetic or magnetizable particles in an ink or coating composition on a sheet of substrate material, the device comprising:

a flat-bed screen-printing unit having a flat printing screen and a printing platen for receiving said sheet, the printing platen having an upper surface facing the printing screen and a first direction along its upper surface along which said sheet is unloadable; and a magnetic orienting unit comprising multiple magnet assemblies;

wherein said magnetic orienting unit is disposed below the upper surface of the printing platen, said multiple magnet assemblies are disposed along said first direction, and all of said magnet assemblies are concomitantly movable from a first position away from the upper surface of the printing platen to a second position close to the upper surface of the printing platen.

2. Device according to claim 1, wherein said magnet assemblies are movable between the first position and the second position in a reciprocating movement along a second direction transverse to the upper surface of the printing platen.

3. Device according to claim 1, wherein said magnet assemblies are movable between the first position and the second position in a forth-back rolling movement.

4. Device according to claim 3, wherein the device is configured to move the magnet assemblies synchronized with the unloading of the sheet, such that a blurring of a produced magnetic image on the sheet is prevented.

5. Device according to claim 1, wherein at least one of the magnet assemblies comprises an engraved and magnetized plate of permanent magnetic material.

6. Device according to claim 5, wherein said engraved and magnetized plate is a composite material, comprising a polymer as a structural binder and a permanent-magnetic powder as filler.

7. Device according to claim 5, wherein at least one of said magnet assemblies comprises at least one additional permanent magnet, mounted in a position which holds the at least one additional permanent magnet against inherent magnetic forces working between the at least one additional permanent magnet and the engraved magnetized plate.

8. Device according to claim 1, wherein the printing screen has a mesh aperture in the range of 40 to 90 micrometers.

9. Device according to claim 8, wherein the mesh aperture is in the range of 50 to 70 micrometers.

10. Device according to claim 6, wherein the polymer is a rubber or plastic polymer.

11. Process for producing indicia comprising:
a) providing a device according to claim 1;
b) loading onto the printing platen of the device a sheet of substrate material carrying at least on a part of the sheet's surface a wet ink or coating composition comprising magnetic or magnetizable pigment particles;
c) concomitantly moving all of the magnet assemblies of the device from a first position away from the upper surface of the printing platen to a second position close to the upper surface of the printing platen, hereby orienting said magnetic or magnetizable pigment particles in the wet ink or coating composition;
d) moving the magnet assemblies back to said first position;
e) unloading the sheet from the printing platen; and
f) curing the ink.

12. Process according to claim 11, wherein said moving of the magnet assemblies between the first position and the second position is performed in a reciprocating movement along a second direction transverse to upper surface of the printing platen.

13. Process according to claim 11, wherein said moving of the magnet assemblies between the first position and the second position is performed in a forth-back rolling movement.

14. Process according to claim 13, wherein said moving of the magnet assemblies and said unloading of the sheet are performed in a synchronized movement so as to prevent blurring of a magnetic image produced on the sheet.

15. Process according to claim 11, wherein the loading a sheet of substrate material onto the printing platen of the device includes coating or imprinting the surface of the sheet at least in part with a wet coating composition or ink comprising magnetic or magnetizable particles.

16. Process according to claim 15, wherein the coating or imprinting is performed using the flat printing screen having a mesh aperture in the range of 40 to 90 micrometers.

17. Process according to claim 16, wherein the mesh aperture is in the range of 50 to 70 micrometers.

18. Process according to claim 15, wherein the coating or imprinting is performed using a composition comprising optically variable magnetic pigment particles.

19. Process according to claim 15, wherein said coating or imprinting is performed concomitant with said magnetic orienting of the pigment particles.

20. Process according to claim 15, wherein said magnet assemblies are moved towards the printing platen before imprinting said sheet.

21. A process comprising:
providing a device according to claim 1: and
using the flat-bed screen-printing unit to produce indicia by magnetic orienting of magnetic or magnetizable particles in a coating composition on a document.

22. The process according to claim 21, wherein said document is chosen from the group consisting of banknotes, value documents, cards, transportation tickets, passports, identity documents, access documents, tax-excise documents, and product labels.

* * * * *